United States Patent
Anderson et al.

[19]

[11] Patent Number: 5,809,211
[45] Date of Patent: Sep. 15, 1998

[54] RAMPING SUSCEPTOR-WAFER TEMPERATURE USING A SINGLE TEMPERATURE INPUT

[75] Inventors: Roger N. Anderson, San Jose; Harold J. Mellen, III, Sunnyvale, both of Calif.

[73] Assignee: Applied Materials, Inc., Santa Clara, Calif.

[21] Appl. No.: 570,395

[22] Filed: Dec. 11, 1995

[51] Int. Cl.$^6$ .............................. G01J 5/28; H01L 21/66; F27B 1/26; F27D 19/00
[52] U.S. Cl. .......................... 392/416; 118/725; 118/728; 364/557; 427/557; 219/390
[58] Field of Search ..................... 392/416, 418; 219/405, 411, 390; 118/724, 725, 728, 730, 50.1; 364/557; 427/521, 557; 437/247, 8

[56] References Cited

U.S. PATENT DOCUMENTS

| | | | |
|---|---|---|---|
| 3,836,751 | 9/1974 | Anderson | 219/411 |
| 4,680,451 | 7/1987 | Gat et al. | 219/411 |
| 4,982,693 | 1/1991 | Ebata | 118/666 |
| 5,098,198 | 3/1992 | Nulman et al. | 374/121 |
| 5,155,337 | 10/1992 | Sorrell et al. | 219/411 |
| 5,359,693 | 10/1994 | Nenyei et al. | 392/418 |
| 5,446,825 | 8/1995 | Moslehi et al. | 392/416 |
| 5,561,612 | 10/1996 | Thakur | 364/557 |

FOREIGN PATENT DOCUMENTS

| | | |
|---|---|---|
| 62-15817 | 1/1987 | Japan . |
| 63-84017 | 4/1988 | Japan . |
| 1-194319 | 8/1989 | Japan . |
| 3-28376 | 2/1991 | Japan . |
| 3-252127 | 11/1991 | Japan . |

*Primary Examiner*—Teresa J. Walberg
*Assistant Examiner*—J. Pelham

[57] ABSTRACT

A method and apparatus for uniformly ramping the temperatures of a wafer and a susceptor using a first heat source primarily directed at the wafer and a second heat source primarily directed at the susceptor while keeping the wafer at approximately the same temperature as the susceptor but measuring only the temperature of the susceptor. The method comprises the steps of: determining and storing a plurality of steady-state temperatures of the susceptor as a function of the total power provided to the first heat source and the second heat source; ramping the susceptor from an initial temperature to a final temperature; and heating the wafer from the initial temperature to the final temperature, wherein the power to the first heat source is determined from the susceptor's temperature and the plurality of steady-state temperatures of the wafer and susceptor as a function of total power.

16 Claims, 7 Drawing Sheets

RAMPING SUSCEPTOR-WAFER TEMPERATURE USING A SINGLE TEMPERATURE INPUT

BACKGROUND OF THE INVENTION

1. Field of the Invention

The field of our invention relates generally to semiconductor manufacturing, and more particularly to a method and apparatus for ramping the temperatures of a wafer and a susceptor using a temperature measuring device which measures only the susceptor's temperature.

2. Prior Art

During the manufacturing of semiconductor devices, thin films are often formed on a wafer surface. A typical processing apparatus used to heat the wafers during this deposition or growth process is illustrated in FIG. 1. The processing apparatus used is often constructed so that a wafer (3) and a susceptor (5) may be heated from both sides by infrared radiation which is usually supplied by infrared lamps. The power to the heat sources, typically infrared lamps (1, 7) may be adjusted so that the heat on the wafer side of the susceptor (typically the top side) is controlled separately from the heat on the opposing side of the susceptor (typically the bottom side) as illustrated in FIG. 1.

In the typical process apparatus, as shown in FIG. 1, power may be applied equally from the top (1) and the bottom (7) to heat the wafer (3) and the susceptor (5), respectively. Because the wafer (3) is thinner and has less thermal mass than the susceptor (5), the wafer (3) heats up at a much faster rate than the susceptor (5). This causes non-uniform heating of the wafer (3) and susceptor (5). In some cases, the wafer (3) can exceed the susceptor's (5) temperature by more than 200° C. during a heat up which could damage the wafer (3).

Another problem is that the wafer (3) also shields energy from the susceptor (5). If the susceptor's (5) edges extend beyond the wafer (3) then the area of the susceptor (5) that is outside the wafer (3) receives energy from both sides and heats up faster than the area underneath the wafer (3).

This causes the center of the susceptor (5) to be cooler than its outside edges after the temperature ramping step. The result is again non-uniform heating of the wafer and the susceptor which can adversely affect a growth or deposition on the surface of the wafer.

One solution to overcome these problems is to use two pyrometers. One pyrometer (9) is used to detect the temperature of the wafer (3) and a second pyrometer (11) is used to detect the temperature of the susceptor (5), as illustrated in FIG. 1. A pyrometer is a device that is sensitive to infrared radiation. The pyrometer collects light emitted from a substrate and then determines the temperature of the substrate based on the light emitted. The power of the first (top) (15) and second (bottom) heat source (13) is controlled separately. The temperature of the susceptor (5) is ramped to a process temperature by controlling the power to the second heat source (7) using conventional Proportional Integral Derivative (PID) algorithm temperature ramping which is well-known to those skilled in the art. The pyrometer (11) monitors the susceptor's (5) temperature which is used to control the amount of radiant energy flux applied by the second heat source (7) to the back surface of the susceptor (5).

A second pyrometer (9) monitoring the wafer's (3) temperature is used to control the radiant energy flux to the wafer (3) side of the susceptor (5). A processing control system (17), such as a microprocessor and memory, compares the wafer (3) temperature to the susceptor (5) temperature and then adjusts the power of the wafer's heat source (1) in an attempt to keep the wafer (3) at approximately the same temperature as the susceptor (5) during the temperature ramp. The temperature of the wafer (3) may be set to be slightly ahead or slightly behind the temperature of the susceptor during the ramp.

A problem with this technique is that one cannot accurately measure the wafer's temperature when depositing a film on the wafer. For example, when one desires to deposit an epitaxial layer on a patterned wafer or to grow a polysilicon or a silicon nitride ($Si_3N_4$) layer on a wafer, the wafer temperature cannot be accurately determined. A thermocouple may not be used because it is a contact device; therefore, it cannot contact the wafer surface as the surface is being changed by a deposition or a growth. The pyrometer also may not be used in those instances because the emissivity of the wafer surface is changed by the growing layer at the wafer surface. This variability of emissivity causes the temperature readout of the pyrometer to be unreliable.

Another problem with this technique is that the power to the first heat source (1) is constantly being changed in an attempt to keep the wafer (3) at approximately the same temperature as the susceptor (5) during the temperature ramp. This resulted in undue stress being placed on the heat source which was typically an infrared lamp or a plurality of infrared lamps.

Thus, what is needed is a method and apparatus which can uniformly ramp the temperatures of a susceptor (5) and a wafer (3) while using a temperature device which measures only the susceptor's (5) temperature.

SUMMARY OF THE INVENTION

The present invention describes a method and apparatus for ramping the temperature of a wafer placed on a wafer holding position of a susceptor, while keeping the wafer at approximately the same temperature as the susceptor during the ramp using a temperature measuring device, such as a pyrometer or a thermocouple, which measures only the susceptor's temperature.

According to the preferred embodiment, a first heat source is primarily directed at the wafer and a second heat source is primarily directed at the susceptor. In accordance with the preferred embodiment of the present invention, the method comprises a series of steps. First, an operator or a control system determines a plurality of steady-state temperatures of the wafer and susceptor as a function of the total power supplied to the first heat source and the second heat source. A graph of these steady-state temperatures as a function of total power is obtained and then stored as a look-up table on a computer's memory for later reference.

The susceptor is heated from an initial temperature to a final temperature. The computer calculates a minimum power value which is the power necessary for the wafer to achieve a steady-state at the current temperature of the susceptor. A maximum power value is calculated, wherein the maximum power value is the power necessary for the wafer to achieve a steady-state at the final temperature. A wafer power level is calculated as the minimum power value plus a selected percentage of the difference between the minimum power value and the maximum power value. The wafer power level is provided to the first heat source.

The second heat source power level is determined by a PID algorithm which is used to ramp the susceptor temperature from the initial temperature to the final temperature.

During this ramp, the power level of the second heat source typically exceeds the power level needed for steady-state operation at the final temperature.

BRIEF DESCRIPTION OF THE DRAWINGS

The present invention is illustrated by way of example and not a limitation in the Figures of the accompanying drawings in which like references indicate similar elements and in which.

DETAILED DESCRIPTION OF THE PRESENT INVENTION

A method and apparatus is described for uniformly ramping the temperatures of a wafer and a susceptor in a semiconductor manufacturing tool or process while directly measuring only the susceptor's temperature throughout the ramping process. In the following description, numerous specific details are given to provide a thorough understanding of the invention, such as the use of a Proportional Integrated Derivative (PID) to ramp the temperature of the susceptor or the use of a pyrometer to detect the susceptor's temperature.

However, it will still be obvious to one skilled in the art that the invention may be practiced without these specific details. Moreover, in some instances, well-known semiconductor equipment and processes have not been set forth in detail in order not to unnecessarily obscure the present invention.

Figure 1:
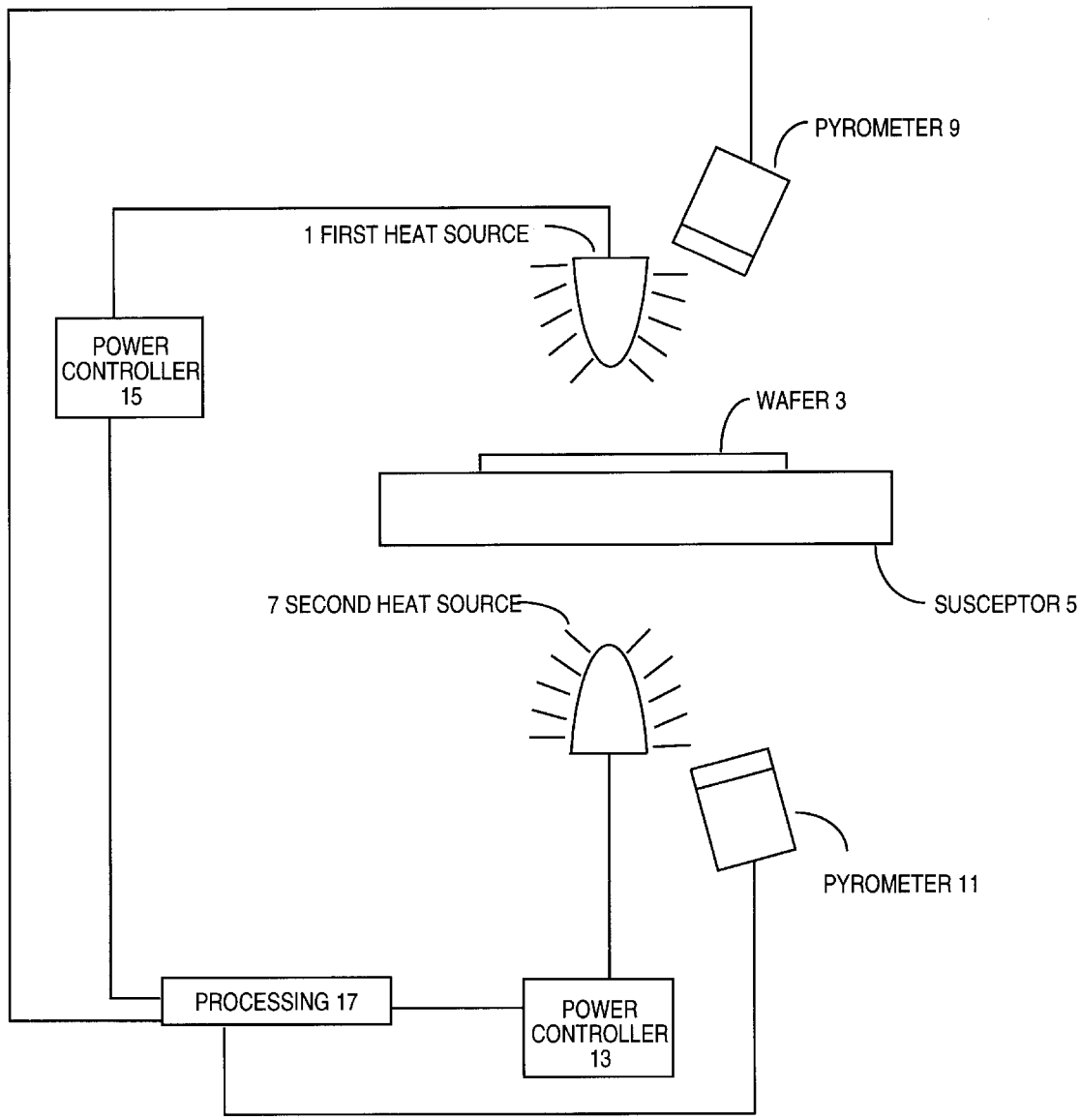
FIG. 1 is an example of a prior art processing apparatus used to heat a wafer and a susceptor during a temperature ramp.
Figure 2:
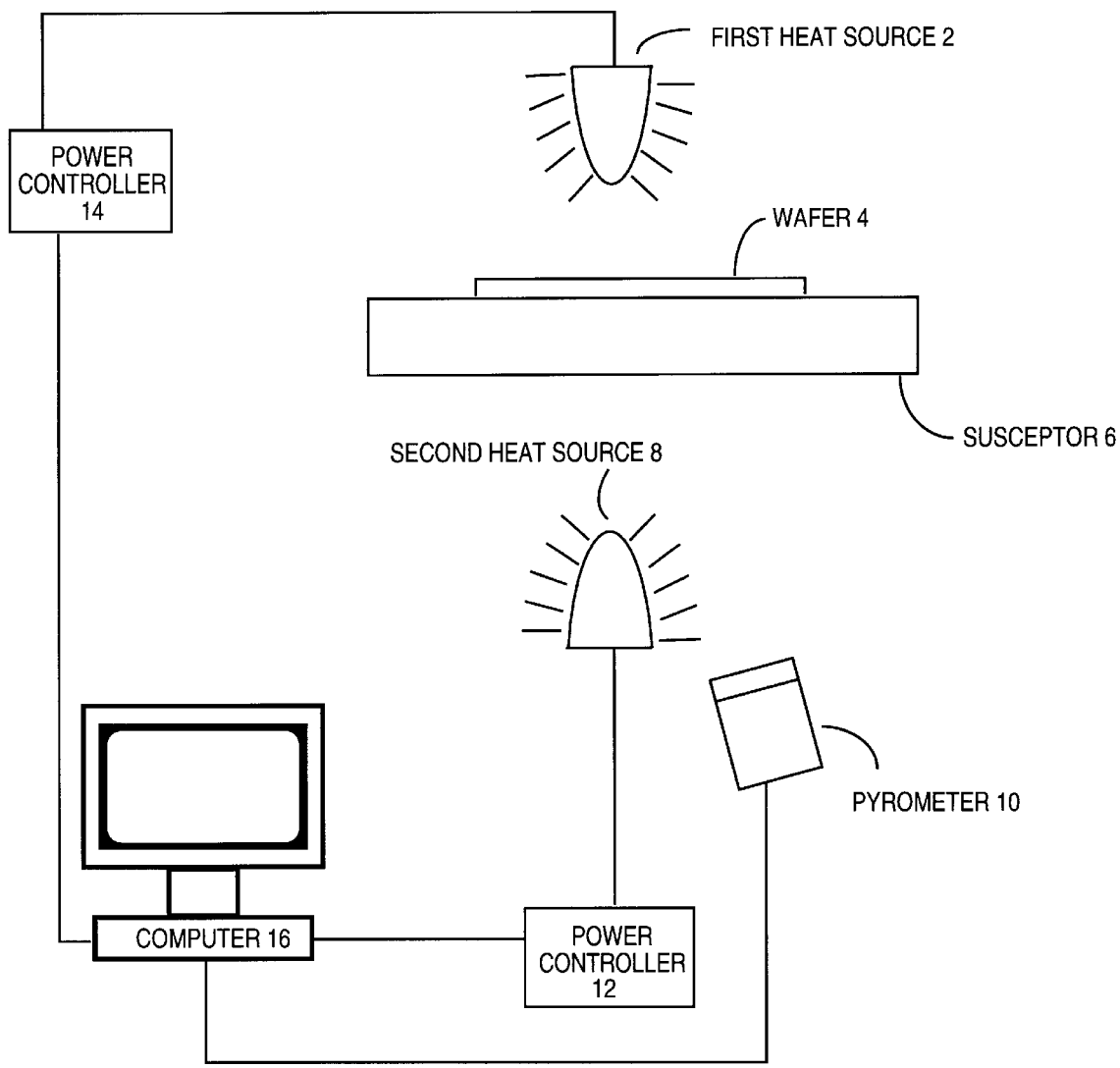
FIG. 2 is an illustration of a processing apparatus used to heat a wafer and a susceptor while only using one temperature measuring device, such as a pyrometer sighted on a susceptor.

The present invention is a method and apparatus for uniformly ramping the temperatures of a susceptor and a wafer while monitoring only the temperature of the susceptor. The susceptor 6 has a wafer holding position for receiving a wafer 4 during the ramping process. According to the preferred embodiment, as illustrated in FIG. 2, there is a first heat source 2, such as infrared lamps directed primarily at the wafer which is controlled by a power controller 14 which in turn is controlled by a computer 16, a type of control system. In addition, according to the preferred embodiment, there is a second heat source 8, such as infrared lamps directed primarily at the susceptor 6 which is controlled by a power controller 12 which in turn is controlled by a PID algorithm on the computer 16. The first heat source 2 and second heat source 8 are of equal sizes and capabilities in the preferred embodiment.

In order to heat up the wafer 4 and susceptor 6 to a final temperature, total power is applied to first heat source 2 and second heat source 8. As the PID algorithm increases the power provided to second heat source 8, the susceptor's 6 temperature will increase until it reaches a final temperature. When the final power is provided to second heat source 8, the susceptor 6 achieves the final temperature. Simultaneously with the ramping of the power provided to second heat source 8, the power provided to first heat source 2 also increases so that the wafer's 4 temperature increases until it reaches the final temperature. When the final power is provided to first heat source 2, wafer 4 achieves the final temperature. Throughout the temperature ramp, the power provided to first heat source 2 is dependent upon the measured temperature of the susceptor 6.

The power provided to first heat source 2 and second heat source 8 may be different percentages of the total power provided to both heat sources (2, 8). Final total power is defined as the amount of power that will be provided to first and second heat sources (2, 8) to heat wafer 4 and susceptor 6, respectively, to a desired final temperature. Final power is defined as the amount of power provided to wafer 4 or susceptor 6 to ramp their respective heat sources (2, 8) so that wafer 4 and susceptor 6 obtain a steady-state at final temperature. For example, if forty percent (40%) of the total power is provided to first heat source 2, and sixty percent (60%) is provided to second heat source 8, then the final power provided to first heat source 2 is forty-percent (40%) of final total power, and the final power provided to second heat source 8 is sixty-percent (60%) of final total power. The above example of different percentages of power being provided to first heat source 2 and second heat source 8 is illustrative and not limiting of the present invention.

A temperature measuring device, such as a pyrometer 10 is used to determine the temperature of the susceptor 6. Throughout the temperature ramp, computer 16 is continually monitoring susceptor's 6 temperature by constantly taking samples utilizing pyrometer 10. The computer 16 then refers to a look-up table based on a power/temperature calibration curve to determine the power that power controller 14 will provide to first heat source 2. Thus, the computer is continually monitoring susceptor's 6 temperature and then adjusting the amount of ramped power that is provided to first heat source 2.

Figure 2A:
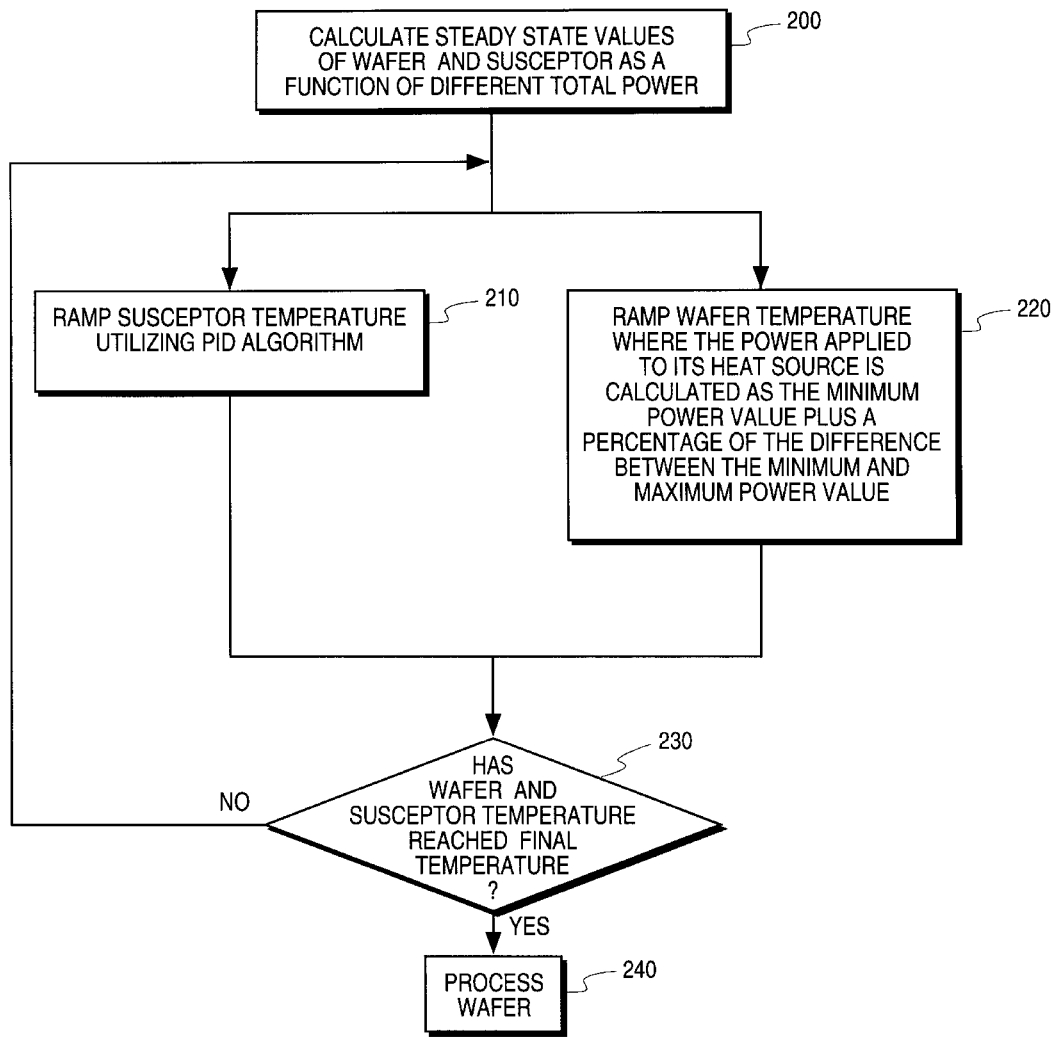
FIG. 2A is a flow chart illustrating the method of the present invention.

FIG. 2A is a flow chart illustrating the method of ramping the temperatures of the wafer 4 and susceptor 6 of the present invention.

According to the preferred embodiment, the first step as illustrated in Block 200 of FIG. 2A, is to determine different steady-state temperatures of the wafer 4 and susceptor 6 as a function of total power. Total power is defined as the sum of the individual power provided to both first heat source 2 and second heat source 8.

To determine steady-state temperature, equal power is applied to first and second heat source (2, 8) to heat wafer 4 and susceptor 6 to the approximate steady-state temperature and then allowed to stabilize for a period of time, typically ten minutes. The steady-state temperature achieved after a period of time, such as ten minutes is then stored in computer 16. It is to be appreciated that both the wafer 4 and susceptor 6 will reach equilibrium at a nearly identical temperature at steady-state (although the wafer 4 will be a little cooler than the susceptor 6). This step is repeated at least three times at different total power levels to obtain at least three correspondingly different steady-state values at various temperatures. The three steady-state values are used to define a power/temperature calibration curve using a mathematical equation. Software utilizes the mathematical equation to generate a look-up table which contains a corresponding power level for a steady-state at each degree of temperature. The look-up table is stored in the computer 16.

Figure 3:
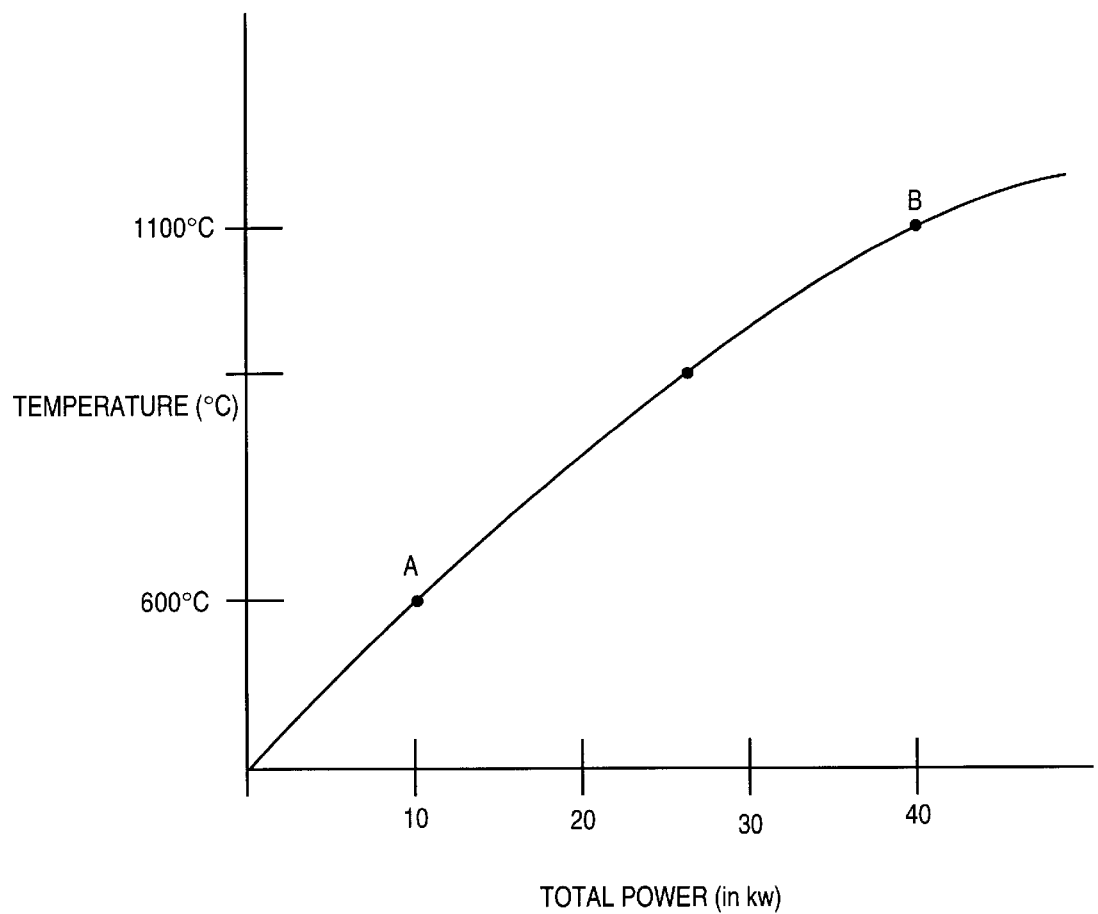
FIG. 3 is an illustration of a power/temperature calibration curve where different total power levels (in kilowatts) were provided to the wafer and susceptor so that the wafer and susceptor achieved different steady-state temperatures over time.

The first step results in a total power to steady-state temperature calibration graph as is illustrated in FIG. 3. The power/temperature calibration graph of FIG. 3 will vary depending on the specific type of apparatus used. The graph is used with a mathematical equation to generate a look-up table. Total power in kilowatts from two infrared heat sources is on the X axis and the steady-state temperature achieved by a certain total power is on the Y axis. For illustration purposes, a total power of 10 kilowatts will produce a steady-state temperature of 600° C. on the susceptor 6, as seen by point A on the graph of FIG. 3. The graph also illustrates that a total power of 40 kw will produce a steady-state temperature of 1100° C., as seen by point B on the graph of FIG. 3.

Based on a power/temperature calibration graph, as illustrated in FIG. 3, one can determine a final total power to reach a steady-state at final temperature. The final temperature is defined as the steady-state temperature at which a process step, such as a deposition, film growth or etch is to take place on the wafer 4.

Figure 4A:
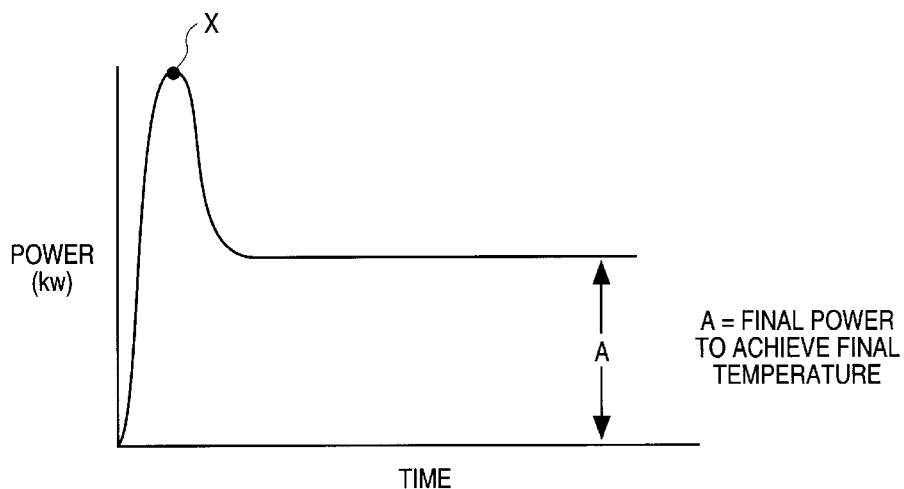
FIG. 4A is an illustration of the ramping of the power provided to a second heat source which is primarily directed at the susceptor while using a Proportional Integral Derivative (PID) algorithm over time.
Figure 4B:
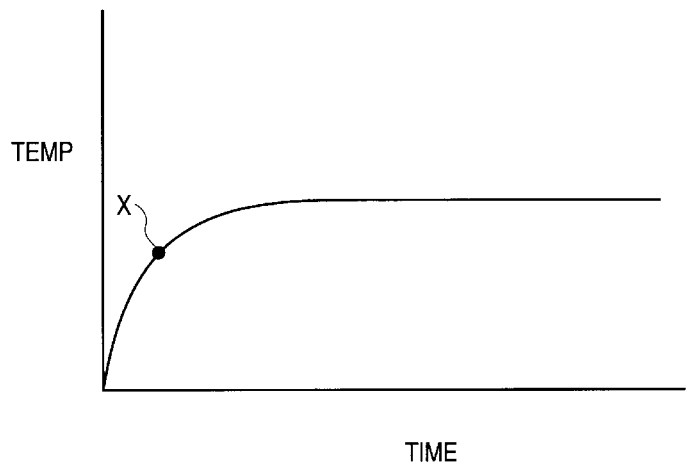
FIG. 4B is an illustration of the susceptor's temperature increasing in response to the power provided to the second heat source which is being ramped utilizing a PID algorithm over time.

According to the preferred embodiment of the present invention, the next step as illustrated in Block 210 of FIG. 2A is to ramp susceptor's 6 temperature. The computer 16 preferably uses a Proportional Integrated Derivative (PID) algorithm which is well known in the art to ramp the susceptor 6 to the desired final temperature. The PID ramp determines the amount of power that will be provided to the second heat source 8 to heat the susceptor 6. The PID algorithm will first overshoot the final power to second heat source 8 to achieve a steady-state at the final temperature in order to ramp the temperature of the susceptor 6 faster. The PID algorithm reduces the amount of power (see point X in FIG. 4A) provided to the susceptor's heat source 8 as the susceptor's 6 temperature nears (see point X in FIG. 4B) the final temperature. The power to the second heat source 8 is gradually decreased until it eventually plateaus at the final power to the second heat source 8 (see A on FIG. 4A) necessary to achieve the final temperature. Thus, the PID algorithm provides a fast ramp of the susceptor's 6 temperature and at the same time prevents the power from significant overshoots and oscillations.

According to the preferred embodiment, while the susceptor's 6 temperature is ramped as illustrated in block 210 of FIG. 2A, the wafer's 4 temperature is also being ramped as illustrated in Block 220. The computer measures susceptor's 6 temperature and then utilizes the look-up table to determine the amount of power to be provided to first heat source 2.

Figure 5:
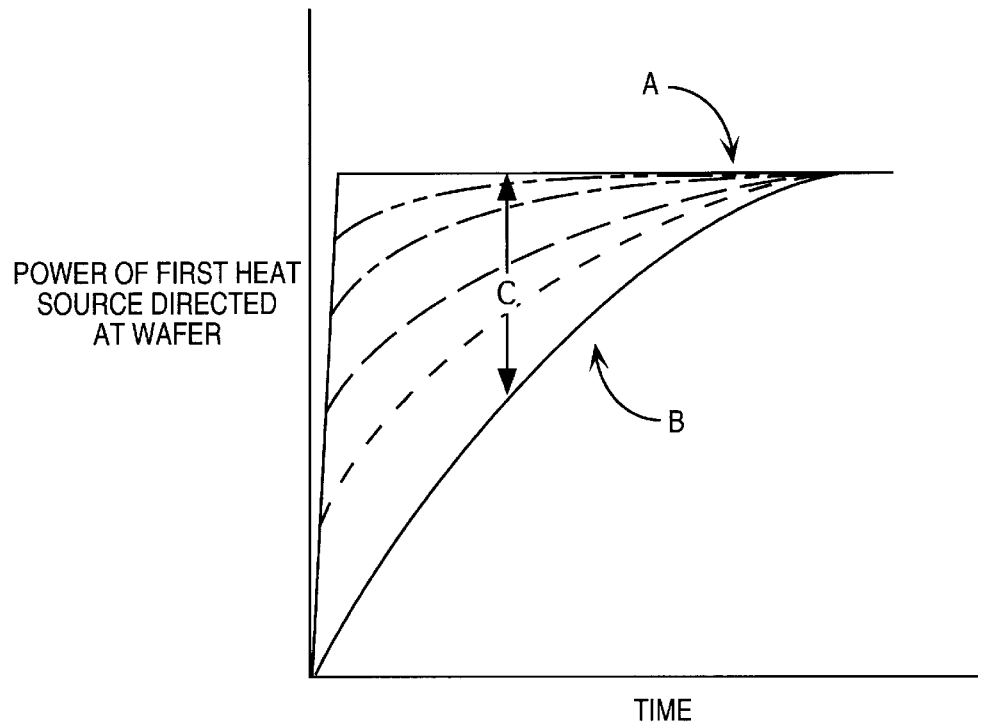
FIG. 5 is an illustration of the power level of the first heat source changing over time based on the measured temperature of the susceptor.

FIG. 5 illustrates several methods for selecting a power level for the first heat source 2 which most directly influences the wafer 4. One method is to select the maximum power value (curve A of FIG. 5) which corresponds to the first heat source's 2 power level at the final temperature. Curve A illustrates the power given to the first heat source 2 being raised immediately to the final power that will heat the wafer 4 to a steady-state at the final temperature. One problem with this extreme is the wafer 4 heats up moderately faster than the susceptor 6.

Another method is to select the minimum power value (curve B of FIG. 5) which is constantly being calculated by computer 16. The minimum power value is obtained by sampling the susceptor's 6 current temperature during the temperature ramp by using pyrometer 10. The computer 16 then refers to the stored look-up table which is based on a power/temperature calibration curve (i.e., see FIG. 3) to determine a power level that corresponds with susceptor's 6 current temperature. One problem with this extreme is the wafer's 4 current temperature lags behind the susceptor's 6 temperature because of the time delay in heating.

Throughout the temperature ramp, the computer 16 is continually sampling and monitoring the susceptor's 6 temperature using pyrometer 10 to determine the minimum power value to provide to first heat source 2. This step will be repeated numerous times during the temperature ramp. Thus, as the temperature of the susceptor 6 is increasing during the ramp, the minimum power value is also increasing. As a result, the temperature of the wafer 4 increases. According to the preferred embodiment, computer 16 samples the temperature of the susceptor 6 at least ten times per second. The computer then recalculates the minimum power value in response to the changing susceptor 6 temperature. Thus, computer 16 continually monitors susceptor's 6 temperature and then recalculates the minimum power value which changes the amount of power provided to first heat source 2.

A third method for selecting a power level for first heat source 2 is to have a control system, such as computer 16 that will allow an operator to choose a set point between or equal to the maximum and minimum power values. In the preferred embodiment, an operator will select a set point which is a percentage of final total power for the first heat source 2 from 0% to 100%. This selected percentage remains constant during the temperature ramp. A 0% set point would ramp the power for the first heat source 2 to the minimum power value. A 100% set point would ramp the power for the first heat source 2 to the maximum power value.

Thus, the power applied to the first heat source 2 is calculated as the minimum power value plus a percentage of the difference between the minimum and maximum power value (as illustrated by area C of FIG. 5).

According to the preferred embodiment, a set point of about fifty-percent (50%) is selected. A 50% set point would be calculated as the minimum power value+0.50 (maximum power value—minimum power value). A fifty-percent set point avoids the two extremes of minimum and maximum power values and the resulting problems.

Throughout the temperature ramp, the pyrometer 10 is measuring the temperature of the susceptor 6 and relaying that information to the computer 16 which utilizes the stored look-up table and then adjusts accordingly the power (12, 14) provided to the second heat source 8 and the first heat source 2. As illustrated in Diamond 230 and Block 240 of FIG. 2A, once the susceptor 6 and the wafer 4 reach the desired final temperature, a film is deposited, grown or etched on the exposed surface of the wafer.

EXAMPLE

Figure 6A:
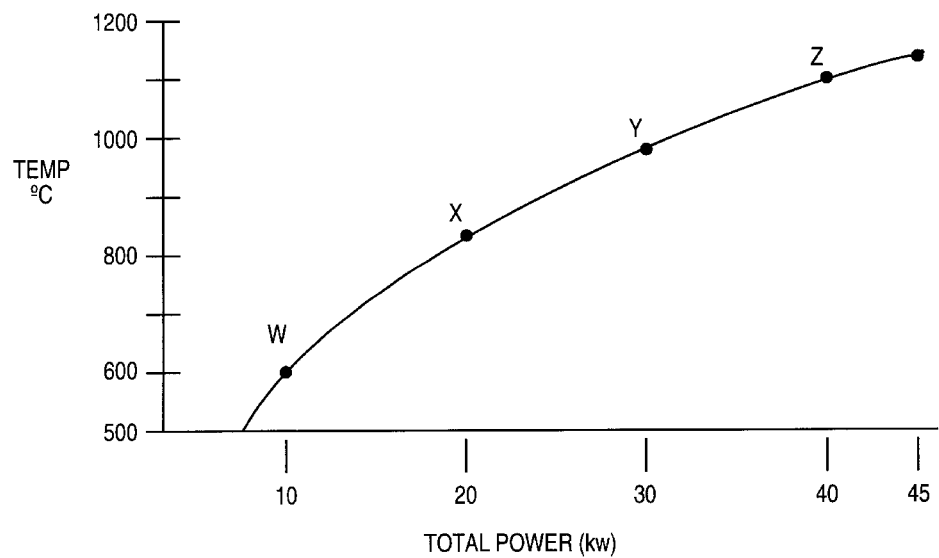
FIG. 6A is an illustration of a power/temperature calibration curve where different total power levels (in kilowatts) were provided to the wafer and susceptor so that the wafer and susceptor achieved different steady-state temperatures over time.

An example is presented of using the method of ramping the temperatures of the wafer 4 and susceptor 6 of the present invention during a process of depositing a film on a wafer 4 at 1100° C. An operator selects a fifty-percent (50%) set point to control the power of the first heat source 2. An operator places a wafer 4 on a wafer holding position on a susceptor 6 before the ramp of the temperatures of the wafer 4 and the susceptor 6 begins. The present invention will uniformly ramp the temperatures of a wafer 4 and a susceptor 6 while measuring and monitoring the temperature of only the susceptor 6. As illustrated in FIG. 6A, a plurality of steady-state temperatures for the wafer and susceptor 6 as a function of total power to both a first heat source 2 and a second heat source 8 were calculated and stored in computer 16 as a look-up table for later reference. A steady-state temperature is the temperature that a wafer 4 and susceptor 6 achieves and maintains as a function of the amount of total power provided to first heat source 2 and second heat source 8.

Figure 6B:
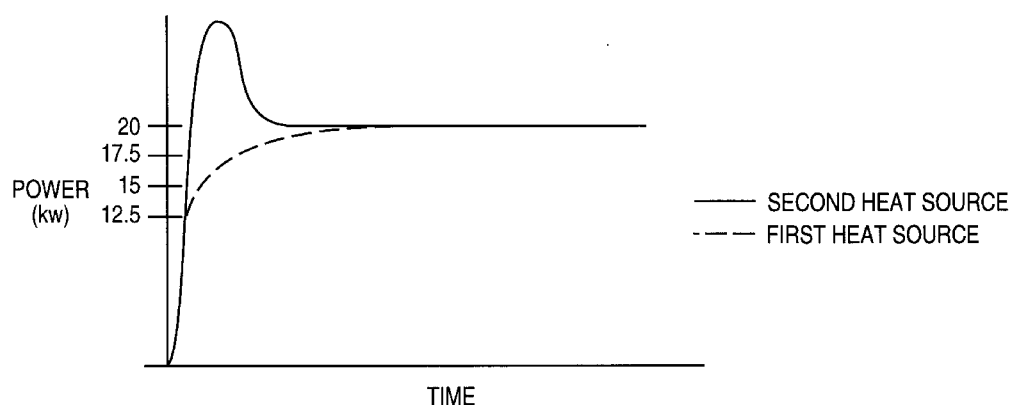
FIG. 6B is an illustration of the power provided to the second heat source being ramped using a PID algorithm over time and of the change in power provided to the first heat source.

This example assumes, for the sake of simplicity that one-half of the total power is applied to the first heat source 2 and one-half of the total power is applied to second heat source 8 at the end of the temperature ramp. Referring to FIG. 6A, since 1100° C. was selected as the desired final temperature according to a process recipe, then a total power of 40 kw is required to achieve a steady-state at the final temperature of 1100° C. This example also assumes that the first and second heat source (2, 8) have equal heat emitting capabilities as in the preferred embodiment. Therefore, 20 kw (which is one-half of 40 kw) is the final power to be provided to the first heat source 2 and 20 kw is the final power to be provided to second heat source 8 to obtain steady-state at the final temperature at 1100° C. The temperature of the susceptor 6 is ramped by ramping the power provided to second heat source 8 to the final power of 20 kw utilizing a PID algorithm (see FIG. 6B).

Once the temperature ramp begins, a computer 16 takes a sample of the susceptor's 6 temperature utilizing pyrometer 10. In the preferred embodiment, a control system, such as computer 16 samples the susceptor's 6 temperature at least ten times per second; however, in order to keep our example simple, we will take only a few samples for discussion.

The maximum power value to be provided to the first heat source 2 is 20 kw which in our example, is one-half of the final total power (40 kw) to achieve a steady-state at a final temperature of 1100° C. (see FIG. 6A). The minimum power value is a power value provided to first heat source 2 which causes the wafer's 4 temperature to follow the susceptor's 6 current temperature. The minimum power value is constantly being calculated by computer 16 and thus changes as the susceptor's 6 temperature changes.

A operator selected a set point of fifty-percent (50%) between the maximum and minimum power value. The power value is calculated as minimum power value+0.50 (maximum power value minimum power value). For example, computer 16 samples susceptor's 6 temperature using pyrometer 10 and the temperature is currently 600° C. The computer 16 calculates the power to provide to first heat source 2 to heat the wafer 4 as minimum power value+0.50 (maximum power value minimum power value) which is 5 kw+0.50 (20 kw–5 kw)=12.5 kw (see FIG. 6A and 6B). 5 kw is the minimum power value when the temperature of susceptor 6 is at 600° C.) After a period of time, the computer 16 again samples the temperature of the susceptor 6 which is now at 830° C. The computer 16 calculates the power to provide to first heat source 2 as minimum power value+0.50 (maximum power value minimum power value) which is 10 kw+0.50 (20 kw–10 kw)=15 kw (see FIG. 6A and 6B). 10 kw is the minimum power value when the temperature of susceptor 6 is at 830° C.) The computer 16 again samples the susceptor's 6 temperature which is currently at 980° C. The computer 16 calculates the power provided to first heat source 2 as minimum power value+ 0.50 (maximum power value—minimum power value) which is 15 kw+0.50 (20 kw–15 kw)=17.5 kw (see FIG. 6A and 6B). After a period of time, the computer again samples the susceptor's 6 temperature which is at 1100° C., the desired final temperature. The computer 16 calculates the power to provide to first heat source 2 as 20 kw+0.50 (20 kw–20 kw)=20 kw (see FIG. 6A and 6B). The wafer 4 is then heated to 1100° C. Thus, the present invention allows a control system, such as a computer 16, to control the wafer's 4 temperature without directly measuring or monitoring the wafer's 4 temperature. Instead, a computer 16 measures and monitors only the susceptor's 6 temperature by using a pyrometer 10.

According to the preferred embodiment of the invention, the first and second heat sources (2, 8) are infrared radiation. In another embodiment of the invention, the heat source could be induction heating, resistance heating, plasma gas or any other heat source. Although the first heat source 2 and the second heat source 8 are of equal size and power capabilities in the preferred embodiment, the heat source could be two heat sources of different sizes and/or capabilities. Furthermore, a control logic algorithm, other than the PID algorithm may be used to control the power provided to second heat source 8. In addition, although a pyrometer 10 is used in the preferred embodiment, a thermocouple or any other temperature measuring device could be used.

The computer 16, a type of control system, shown in FIG. 2 is defined as having a processor, a memory and an input and output device. A computer program stored in memory determines and controls the power provided to the first and second heat sources (2, 8). Although a computer 16, is shown performing a processing function by monitoring the temperature of the susceptor 6 and thus determining and controlling the temperature of the wafer 4, other possibilities exist. For example, one could use an Application-Specific Integrated Circuit (ASIC) device, Programmable Logic Device (PLD), or hard wire logic circuits.

In the preferred embodiment, an operator selects a power level based on a percentage between or equal to the minimum power value and the maximum power value for the wafer's 4 heat source 2. The percentage remains constant during a temperature ramp. Theoretically, the percentage (set point) selected may be changed throughout the temperature ramp. For example, one may start with a lower percentage (set point) at the beginning of a ramp then increase the percentage as the ramp progresses.

In the preferred embodiment, the operator selects a set point which is a percentage of final total power for first heat source 2 from 0% to 100%.

However, the range for the percentage could be from less than 0% to greater than 100%.

In the above description, numerous specific details were given to be illustrative and not limiting of the present invention. It will still be obvious to one skilled in the art that the invention may be practiced without these specific details.

Moreover, in some instances, well-known semiconductor equipment and processes have not been set forth in detail in order not to unnecessarily obscure the present invention. Thus, the method and apparatus of the present invention is defined by the appended claims.

Thus, a method and apparatus has been described for uniformly ramping the temperatures of a wafer and a susceptor and wherein, the method and apparatus controls wafer temperature without directly monitoring the wafer's temperature but by solely measuring and monitoring the susceptor's temperature throughout the temperature ramping process.

We claim:

1. A method for ramping a wafer and a susceptor to a higher temperature using a first heat source which most directly influences said wafer temperature and a second heat source which most directly influences said susceptor temperature, while keeping said wafer at approximately the same temperature as said susceptor, said method comprising the steps of:
    a) ramping said susceptor from an initial temperature to a final temperature; and
    b) heating said wafer so that said wafer is ramped from said initial temperature to said final temperature, wherein said first heat source is controlled by said susceptor temperature in conjunction with utilizing a plurality of steady-state temperatures of said wafer and said susceptor as a function of total power applied to said first heat source and said second heat source, wherein said plurality of steady-state temperatures is stored in a computer.

2. A method for ramping the temperature of a wafer and a susceptor, using a first heat source which most directly influences said wafer temperature, a second heat source which most directly influences said susceptor temperature, so that said wafer is kept at approximately the same temperature as said susceptor during a ramp, said method comprising the steps of:
    a) providing a plurality of steady-state temperatures of said wafer and said susceptor as a function of total power applied to said first heat source and said second heat source;
    b) applying power to said second heat source to ramp the temperature of said susceptor from a first temperature to a final temperature;
    c) determining a current temperature of said susceptor during said ramping step; and
    d) utilizing said steady state values, and said current temperature to apply power to said first heat source, wherein said power to said first heat source is:
        i) less than or substantially equal to the power necessary to achieve steady state at said final temperature, and
        ii) is greater than or substantially equal to the power that corresponds to steady state at said current temperature of said susceptor.

3. A method, as in claim 2, wherein said ramping of said susceptor in step b) is a Proportional Integrated Derivative (PID) ramp.

4. A method for ramping a wafer and a susceptor to a higher temperature, using a first heat source positioned opposite said wafer and a second heat source positioned opposite said susceptor, so that said wafer is kept at approximately the same temperature as said susceptor based on said susceptor temperature, said method comprising the steps of:
    a) providing a plurality of steady-state temperatures of said susceptor as a function of total power to said first heating source and said second heating source;
    b) applying power to said second heat source to heat said susceptor from an initial temperature to a final temperature;
    c) measuring a current temperature of said susceptor during said heating
    d) utilizing said steady-state values to calculate a minimum power value, wherein said minimum power value is the power that is necessary for said wafer to achieve steady state at said current temperature of said susceptor;
    e) utilizing said steady state values to calculate a maximum power value, wherein said maximum power value is the power that is necessary for said wafer to achieve steady state at said final temperature;
    f) selecting a percentage
    g) determining a wafer power level to be applied to said first heat source, wherein said wafer power level is calculated as said minimum power value plus said selected percentage of the difference between said maximum power value and said minimum power value; and
    h) providing power to said first heat source in accordance with said wafer power level.

5. An apparatus for ramping the temperatures of a wafer and a susceptor while keeping said wafer at approximately the same temperature as said susceptor while measuring said susceptor's temperature, said apparatus comprising:
    a susceptor;
    a wafer holding position in close proximity to said susceptor;
    a first heat source for heating said wafer holding position;
    a second heat source for heating said susceptor; and
    means for determining a power level applied to said first heat source, wherein said means perform the steps of:
    a) providing a plurality of steady-state temperatures of said wafer and said susceptor as a function of total power applied to said first heat source and said second heat source;
    b) ramping the temperature of said susceptor from a first temperature to a final temperature;
    c) determining a current temperature of said susceptor during said ramping step; and
    d) ramping the temperature of said wafer by applying a power to said first heat source, wherein said power is:
        i) less than or substantially equal to said power necessary to achieve a steady-state at said final temperature, and
        ii) is greater than or substantially equal to said power that corresponds to a steady-state at said susceptor's current temperature.

6. An apparatus for ramping the temperatures of a wafer and a susceptor while keeping said wafer at approximately the same temperature as said susceptor while measuring said susceptor's temperature, said apparatus comprising:
    a susceptor;
    a wafer holding position on said susceptor;
    a first heat source primarily directed at said wafer;
    a second heat source primarily directed at said susceptor; and
    means for determining a power level applied to said first heat source and said second heat source during said temperature ramp, wherein said means performs the steps comprising of:

a) determining a plurality of steady-state temperatures of said susceptor as a function of total power to said first heating source and said second heating source;
b) heating said susceptor from an initial temperature to a final temperature;
c) calculating a minimum power value, wherein said minimum power value is a first power that is necessary for said wafer to achieve a steady-state at the current temperature of said susceptor;
d) calculating a maximum power value, wherein said maximum power value is a second power that is necessary for said wafer to achieve a steady-state at said final temperature;
e) determining a wafer power level to be applied to said first heat source, wherein said wafer power level is calculated as said minimum power value plus a percentage of the difference between said maximum power value and said minimum power value;
f) selecting said percentage of the difference between said maximum power value and said minimum power value; and
g) providing said wafer power level to said first heat source.

7. A program storage device readable by a machine, tangibly embodying a program of instructions executable by said machine to perform method steps for ramping the temperatures of a wafer and a susceptor such that said wafer is kept at approximately the same temperature as said susceptor, said method steps comprising:
a) providing values of steady-state temperatures of said wafer and said susceptor as a function of total power applied to a first heat source and a second heat source;
b) providing power to said second heat source to ramp the temperature of said susceptor from a first temperature to a final temperature;
c) determining a current temperature of said susceptor during said ramping step; and
d) utilizing said steady state values and said current temperature to provide power to said first heat source to ramp the temperature of said wafer, wherein said power is:
  i) less than or substantially equal to the power necessary to achieve steady state at said final temperature, and
  ii) is greater than or substantially equal to the power that corresponds to steady state at said current temperature.

8. A program storage device readable by a machine, tangibly embodying a program of instructions executable by said machine to perform method steps for ramping the temperature of a wafer and a susceptor, using a first heat source primarily directed at said wafer and a second heat source primarily directed at said susceptor, so that said wafer is kept at approximately the same temperature as said susceptor during a ramp, said method steps comprising:
a) determining values of steady-state temperatures of said susceptor as a function of total power to said first heating source and said second heating source;
b) applying power to said second heat source to heat said susceptor from an initial temperature to a final temperature;
c) measuring a current temperature of said susceptor during said heating
d) utilizing said steady-state values to calculate a minimum power value, wherein said minimum power value is a first power that is necessary for said wafer to achieve steady state at the current temperature of said susceptor;
e) utilizing said steady-state values to calculate a maximum power value, wherein said maximum power value is a second power that is necessary for said wafer to achieve steady state at said final temperature;
f) selecting a percentage
g) determining a wafer power value to be applied to said first heat source, wherein said wafer power value is calculated as said minimum power value plus said selected percentage of the difference between said maximum power value and said minimum power value; and
h) providing power to said first heat source in accordance with said wafer power value.

9. A computer-implemented method for ramping a wafer and a susceptor to a higher temperature, comprising:
providing a plurality of steady-state temperatures of said wafer and said susceptor as a function of total power applied to a wafer heat source and a susceptor heat source;
providing power to said susceptor heat source to ramp said susceptor to a higher temperature;
measuring said susceptor's temperature;
determining said wafer's temperature based on said susceptor's temperature; and
providing power to said wafer heat source based on said wafer's temperature and said plurality of steady-state temperatures, wherein said wafer heat source is positioned opposite said wafer.

10. The computer-implemented method of claim 9, further comprising:
ramping the temperature of said susceptor from a first temperature to a final temperature;
determining a current temperature of said susceptor during said ramping step; and
ramping the temperature of said wafer by applying a power to said wafer heat source, wherein said power is:
  (i) less than or substantially equal to the power necessary to achieve a steady-state at said final temperature; and
  (ii) is greater than or substantially equal to the power that corresponds to a steady-state at said susceptor's current temperature.

11. A computer-implemented method for ramping a wafer placed on a susceptor and said susceptor to a higher temperature, said method comprising:
providing a plurality of steady-state temperatures of said wafer and said susceptor as a function of total power applied to said first heat source positioned opposite said wafer and to a second heat source positioned opposite said susceptor;
selecting a percentage set point to control the power of a first heat source;
providing power to said second heat source to ramp said susceptor to a final temperature;
measuring susceptor's temperature during ramping step; and
providing power to said first heat source based on said percentage set point relative to said plurality of steady-state temperatures of said susceptor and said wafer, wherein said wafer's temperature is derived from said susceptor's temperature.

12. A computer-implemented method, comprising:
providing a plurality of steady-state temperatures of a wafer and a susceptor as a function of total power applied to a heat source;

providing power to said heat source to ramp the temperature of said susceptor;

monitoring said the temperature of said susceptor during ramp; and determining the temperature of said wafer from said temperature of said susceptor.

13. The computer-implemented method of claim 12, further including the step of:

providing power to said wafer's heat source based on said wafer's temperature and said plurality of steady-state temperatures of said wafer and said susceptor.

14. A method of ramping a wafer and a susceptor to a higher temperature, comprising the steps of:

storing data in a computer, wherein said data comprises values of steady-state temperatures of said wafer and said susceptor as a function of total power applied to a first heat source which most directly influences the temperature of said wafer and to a second heat source which most directly influences the temperature of said susceptor;

providing power to said second heat source to ramp said susceptor's temperature;

monitoring the temperature of said susceptor during ramp; and providing power to said first heat source based on said susceptor's temperature and said data.

15. A method of ramping the temperature of a susceptor and a wafer located on the susceptor, comprising the steps of:

providing power to a heat source, wherein the power is a function of the temperature of said susceptor and computer stored data comprising values of steady-state temperatures of said wafer and said susceptor as a function of heating power supplied.

16. A system for controlling the temperature of a susceptor and a wafer located on the susceptor, comprising:

a temperature sensor sensing the temperature of the susceptor;

a heat source; and a computer with stored data comprising steady-state temperatures of said susceptor and said wafer as a function of power supplied to said heat source, wherein said heat source provides heat to said wafer based on said temperatures of said susceptor and said data.

* * * * *